(12) United States Patent
Liu et al.

(10) Patent No.: US 6,523,165 B2
(45) Date of Patent: Feb. 18, 2003

(54) ALTERNATING PHASE SHIFT MASK DESIGN CONFLICT RESOLUTION

(75) Inventors: Hua-Yu Liu, Palo Alto, CA (US); Christophe Pierrat, Santa Clara, CA (US); Kent Richardson, Mountain View, CA (US)

(73) Assignee: Numerical Technologies, Inc., San Jose, CA (US)

( * ) Notice: Subject to any disclaimer, the term of this patent is extended or adjusted under 35 U.S.C. 154(b) by 0 days.

(21) Appl. No.: 09/905,420

(22) Filed: Jul. 13, 2001

(65) Prior Publication Data

US 2003/0014732 A1 Jan. 16, 2003

(51) Int. Cl.[7] .................................. G06F 17/50
(52) U.S. Cl. .................. 716/21; 716/2; 716/19; 716/20
(58) Field of Search .................. 716/2, 19–21; 435/410

(56) References Cited

U.S. PATENT DOCUMENTS

| | | | |
|---|---|---|---|
| 4,037,918 A | 7/1977 | Kato | 350/3.5 |
| 4,456,371 A | 6/1984 | Lin | 355/71 |
| 5,302,477 A | 4/1994 | Dao et al. | 430/5 |
| 5,308,741 A | 5/1994 | Kemp | 430/312 |
| 5,316,878 A | 5/1994 | Saito et al. | 430/5 |
| 5,324,600 A | 6/1994 | Jinbo et al. | 430/5 |
| 5,328,807 A | 7/1994 | Tanaka et al. | 430/311 |
| 5,334,542 A | 8/1994 | Saito et al. | 437/40 |
| 5,352,550 A | 10/1994 | Okamoto | 430/5 |
| 5,364,716 A | 11/1994 | Nakagawa et al. | 430/5 |

(List continued on next page.)

FOREIGN PATENT DOCUMENTS

| | | |
|---|---|---|
| DE | 195 45 163 A1 | 6/1996 |
| EP | 0 464 492 A1 | 1/1992 |
| EP | 0 653 679 A2 | 5/1995 |
| EP | 0 698 821 | 2/1996 |
| GB | 2333613 A | 7/1999 |

(List continued on next page.)

OTHER PUBLICATIONS

Ackmann, P. et al., "Phase Shifting And Optical Proximity Corrections To Improve CD Control On Logic Devices In Manufacturing For Sub 0.35 $\mu$m I–Line", Advance Micro Devices (8 pages).

Asai, S. et al., "High Performance Optical Lithography Using A Separated Light Source", *J. Vac. Sci. Technol. B*, vol. 10, No. 6, pp. 3023–3026, Nov./Dec. 1992.

Barouch, E. et al., "OPTIMASK: An OPC Algorithm For Chrome And Phase–Shift Mask Design", *SPIE*, vol. 2440, pp. 192–206, Feb. 1995.

(List continued on next page.)

*Primary Examiner*—Matthew Smith
*Assistant Examiner*—Thuan Do
(74) *Attorney, Agent, or Firm*—Erik L. Oliver; Bever, Hoffman & Harms, LLP

(57) ABSTRACT

Methods and apparatuses for preparing layouts and masks that use phase shifting to enable production of subwavelength features on an integrated circuit in close (optical) proximity to other structures are described. One embodiment selects from several strategies for resolving conflicts between phase shifters used to define features and (optically) proximate structures that are being defined other than by phase shifting. One embodiment adds additional phase shifters to define the conflicting structures. Another embodiment optically corrects the shape of the phase shifters in proximity to a conflicting structure. Resulting integrated circuits can include a greater number of subwavelength features even in areas that are in close proximity to structures that were not initially identified for production using a phase shifting mask.

26 Claims, 4 Drawing Sheets

U.S. PATENT DOCUMENTS

| | | | |
|---|---|---|---|
| 5,424,154 A | 6/1995 | Borodovsky | 430/5 |
| 5,472,814 A | 12/1995 | Lin | 430/5 |
| 5,480,746 A | 1/1996 | Jinbo et al. | 430/5 |
| 5,496,666 A | 3/1996 | Chu et al. | 430/5 |
| 5,498,579 A | 3/1996 | Borodovsky et al. | 437/250 |
| 5,503,951 A | 4/1996 | Flanders et al. | 430/5 |
| 5,523,186 A | 6/1996 | Lin et al. | 430/5 |
| 5,527,645 A | 6/1996 | Pati et al. | 430/5 |
| 5,532,090 A | 7/1996 | Borodovsky | 430/5 |
| 5,537,648 A | 7/1996 | Liebmann et al. | 395/500 |
| 5,538,815 A | 7/1996 | Oi et al. | 430/5 |
| 5,539,568 A | 7/1996 | Lin et al. | 359/285 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |
| 5,635,316 A | 6/1997 | Dao | 430/5 |
| 5,636,131 A * | 6/1997 | Liebmann et al. | 716/19 |
| 5,702,848 A | 12/1997 | Spence | 430/5 |
| 5,725,969 A | 3/1998 | Lee | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,807,649 A | 9/1998 | Liebmann et al. | 430/5 |
| 5,827,623 A | 10/1998 | Ishida et al. | 430/5 |
| 5,858,580 A | 1/1999 | Wang et al. | 430/5 |
| 5,885,734 A | 3/1999 | Pierrat et al. | 430/5 |
| 5,923,562 A * | 7/1999 | Liebmann et al. | 716/19 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,004,702 A | 12/1999 | Lin | 430/5 |
| 6,010,807 A | 1/2000 | Lin | 430/5 |
| 6,057,063 A | 5/2000 | Liebmann et al. | 430/5 |
| 6,066,180 A | 5/2000 | Kim et al. | 716/19 |
| 6,077,630 A | 6/2000 | Pierrat | 430/5 |
| 6,083,275 A | 7/2000 | Heng et al. | 716/19 |
| 6,130,012 A | 10/2000 | May et al. | 430/5 |
| 6,139,994 A | 10/2000 | Broeke, et al. | 430/5 |
| 6,185,727 B1 | 2/2001 | Liebmann | 716/19 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,312,854 B1 * | 11/2001 | Chen et al. | 435/410 |
| 6,335,128 B1 | 1/2002 | Cobb et al. | 430/5 |
| 6,338,922 B1 * | 1/2002 | Liebmann et al. | 716/21 |
| 2001/0000240 A1 | 4/2001 | Wang et al. | 430/5 |
| 2001/0028985 A1 | 10/2001 | Wang et al. | 430/5 |

FOREIGN PATENT DOCUMENTS

| | | |
|---|---|---|
| JP | 62067547 | 3/1987 |
| JP | 2-140743 | 5/1990 |
| JP | 7-111528 | 2/1991 |
| JP | 6-67403 | 3/1994 |
| JP | 8-51068 | 2/1996 |
| JP | 2650962 | 2/1996 |
| JP | 8-236317 | 9/1996 |
| JP | 2638561 | 4/1997 |
| JP | 2560962 | 5/1997 |
| JP | 10-133356 | 5/1998 |
| JP | 11-143085 | 5/1999 |
| WO | WO 98/12605 A1 | 3/1998 |
| WO | WO 01/23961 A1 | 4/2001 |
| WO | WO 02/03140 A1 | 1/2002 |

OTHER PUBLICATIONS

Brunner, T. et al., "170nm Gates Fabricated By Phase–Shift Mask And Top Anti–Reflector Process", *SPIE*, Optical/Laser Microlithography VI, vol. 1927, pp. 182–189 (1993).

Brunner, T., "Rim Phase–Shift Mask Combined With Off–Axis Illumination: A Path To 0.5λ/Numerical Aperture Geometries", *Optical Engineering*, vol. 32, No. 10, pp. 2337–2343, Oct. 1993.

Fukuda, H. et al., "Determination Of High–Order Lens Aberration Using Phase/Amplitude Linear Algebra", *J. Vac. Sci. Technol. B*, vol. 17, No. 6, pp. 3318–3321, Nov./Dec. 1999.

Fukuda, H., "Node–Connection/Quantum Phase–Shifting Mask: Path To Below 0.3 μm Pitch, Proximity Effect Free, Random Interconnects And Memory Patterning", *J. Vac. Sci. Technol. B*, vol. 17, No. 6, pp. 3291–3295, Nov./Dec. 1999.

Galan, G. et al., "Application Of Alternating–Type Phase Shift Mask To Polysilicon Level For Random Logic Circuits", *Jpn. J. Appl. Phys.*, vol. 33, pp. 6779–6784 (1994).

Inokuchi, K. et al., "Sub–Quarter Micron Gate Fabrication Process Using Phase–Shifting–Mask For Microwave GaAs Devices", Extended Abstracts of the 1991 Intl. Conference on Solid State Devices and Materials, Yokohama, Japan, pp. 92–94 (1991).

Inokuchi, K. et al., "Sub–Quarter–Micron Gate Fabrication Process Using Phase–Shifting Mask For Microwave GaAs Devices", *Japanese Journal of Applied Physics*, vol. 30, No. 12B, pp. 3818–3821, Dec. 1991.

Ishiwata, N. et al., "Novel Alternating Phase Shift Mask With Improved Phase Accuracy", *SPIE*, Proceedings of the 17th Annual Symposium on Photomask Technology and Management, vol. 3236, pp. 243–249 (1997).

Jinbo, H. et al., "0.2 μm Or Less i–Line Lithography By Phase–Shifting–Mask Technology", *IEEE*, pp. 33.3.1–33.3.4 (1990).

Jinbo, H. et al., "Application Of Blind Method To Phase–Shifting Lithography", *IEEE*, 1992 Symposium on VLSI Technology Digest of Technical Papers, pp. 112–113 (1992).

Jinbo, H. et al., "Improvement Of Phase–Shifter Edge Line Mask Method", *Japanese Journal of Applied Physics*, vol. 30, No. 11B, pp. 2998–3003, Nov. 1991.

Karklin, L., "A Comprehensive Simulation Study Of The Photomask Defects Printability", *SPIE*, vol. 2621, pp. 490–504 (1995).

Kimura, T. et al., "Subhalf–Micron Gate GaAs Mesfet Process Using Phase–Shifting–Mask Technology", *IEEE*, GaAs IC Symposium, pp. 281–284 (1991).

Levenson, M. et al., "Improving Resolution In Photolithography With A Phase–Shifting Mask", *IEEE* Transactions on Electron Devices, vol. ED–29, No. 12, pp. 1828–1836, Dec. 1982.

Lin, B.J., "Phase–Shifting Masks Gain An Edge", *IEEE* Circuits & Devices, pp. 28–35, Mar. 1993.

Liu, H.Y. et al., "Fabrication of 0.1 μm T–Shaped Gates By Phase–Shifting Optical Lithography", *SPIE*, Optical/Laser Microlithography VI, vol. 1927, pp. 42–52 (1993).

Matsuoka, K. et al., "Application Of Alternating Phase–Shifting Mask To 0.16 μm CMOS Logic Gate Patterns", Matsushita Electric Ind. Co., Ltd. (9 pages).

Mizuno, F. et al., "Practical Phase–Shifting Mask Technology For 0.3 μm Large Scale Integrations", *J. Vac. Sci. Technol. B*, vol. 12, No. 6, pp. 3799–3803, Nov./Dec. 1994.

Morimoto, H. et al., "Next Generation Mask Strategy—Technologies Are Ready For Mass Production Of 256MDRAM?", *SPIE*, vol. 3236, pp. 188–189 (1997).

Neureuther, A., "Modeling Phase Shifting Masks", *SPIE*, 10th Annual Symposium on Microlithography, vol. 1496, pp. 80–85 (1990).

Nistler, J. et al., "Large Area Optical Design Rule Checker For Logic PSM Application", *SPIE*, Photomask and X–Ray Mask Technology, vol. 2254, pp. 78–92 (1994).

Nistler, J. et al., "Phase Shift Mask Defect Printability Analysis", Proceedings of the Microlithography Seminar INTERFACE '93, OCG Microelectronic Materials, Inc., pp. 11–28 (1993).

Ohtsuka, H. et al., "Phase Defect Repair Method For Alternating Phase Shift Masks Conjugate Twin–Shifter Method", *Jpn. J. Appl. Phys.*, vol. 31, pp. 4143–4149 (1992).

Pati, Y.C. et al., "Phase–Shifting Masks For Microlithography: Automated Design And Mask Requirements", *J. Opt. Soc. Am.*, vol. 11, No. 9, pp. 2438–2452, Sep. 1994.

Pierrat, C. et al., "A Rule–Based Approach To E–Beam And Process–Induced Proximity Effect Correction For Phase–Shifting Mask Fabrication", *SPIE*, vol. 2194, pp. 298–309 (1994).

Pierrat, C. et al., "Phase–Shifting Mask Topography Effects On Lithographic Image Quality", *IEEE*, pp. 3.3.1–3.3.4 (1992).

Rieger, M. et al., "System For Lithography Proximity Compensation", Precim Company, Portland, Oregon, Sep. 1993 (28 pages).

Roman, B. et al., "Implications Of Device Processing On Photomask CD Requirements", *SPIE*, vol. 3236 (1997) (Abstract Only).

Spence, C. et al., "Automated Determination Of CAD Layout Failures Through Focus: Experiment And Simulation", *SPIE*, vol. 2197, pp. 302–313 (1994).

Spence, C. et al., "Detection Of 60° Phase Defects On Alternating PSMs", Advance Micro Devices, KLA–Tencor, DuPont RTC (2 pages).

Spence, C. et al., "Integration Of Optical Proximity Correction Strategies In Strong Phase Shifters Design For Poly–Gate Layers", *Bacus News*, vol. 15, Issue 12, pp. 1, 4–13, Dec. 1999.

Stirniman, J. et al., "Wafer Proximity Correction And Its Impact On Mask–Making", *Bacus News*, vol. 10, Issue 1, pp. 1, 3–7, 10–12, Jan. 1994.

Sugawara, M. et al., "Defect Printability Study Of Attenuated Phase–Shifting Masks For Specifying Inspection Sensitivity", Semiconductor Company, Sony Corporation, Kanagawa, Japan (16 pages).

Terasawa, T. et al., "0.3–Micron Optical Lithography Using A Phase–Shifting Mask", *SPIE*, Optical/Laser Microlithography II, vol. 1088, pp. 25–33, Mar. 1989.

Watanabe, H. et al., "Detection And Printability Of Shifter Defects In Phase–Shifting Mask II Defocus Characteristics", *Jpn. J. Appl. Phys.*, vol. 31, pp. 4155–4160 (1992).

Wiley, J. et al., "Phase Shift Mask Pattern Accuracy Requirements And Inspection Technology", *SPIE*, Integrated Circuit Metrology, Inspection, and Process Control V, vol. 1464, pp. 346–355 (1991).

Schmidt, R., et al., "Impact of Coma on CD Control for Multiphase PSM Designs", AMD, ASML (11 pages).

Erdmann, A., "Topography Effects and Wave Aberrations in Advanced PSM–Technology", Fraunhofer Institute of Integrated Circuits (11 pages).

Granik, Y., et al., "CD Variation Analysis Technique and its Application to the Study of PSM Mask Misalignment", Mentor Graphics (9 pages).

Hanyu, et al., "New Phase–Shifting Mask with Highly Transparent SiO2 Phase Shifters", Fujitsu Laboratories Ltd. (11 pages).

Ishiwata, N., et al., "Fabrication of Phase–Shifting Mask", Fujitsu Limited (11 pages).

Levenson, M., et al., "Phase Phirst! An Improved Strong–PSM Paradigm", M.D. Levenson Consulting, Petersen Advanced Lithography, KLA–Tencor (10 pages).

Levenson, M., et al., "SCAA Mask Exposures and Phase Phirst Design for 110nm and Below", M.D. Levenson Consulting, Canon USA, Inc., JSR Microelectronics, Inc. (10 pages).

Lin, B.J., "The Relative Importance of the Building Blocks for 193nm Optical Lithography", Linnovation, Inc. (12 pages).

McCallum, M., et al., "Alternating PSM Mask Performance—a Study of Multiple Fabrication Technique Results", International SEMATECH (6 pages).

Morikawa, Y., et al., "100nm–alt.PSM Structure Discussion for ArF Lithography", Dai–Nippon Printing Co., Ltd. (15 pages).

Ozaki, T., et al., "A 0.15um KrF Lithography for 1Gb DRAM Product Using Highly Printable Patterns and Thin Resist Process", Toshiba Corporation (2 pages).

Rhyins, P., et al., "Characterization of Quartz Etched PSM Masks for KrF Lithography at the 100nm Node", Photronics, Inc., MIT Lincoln Lab, ARCH Chemicals, Finle Technologies, KLATencor Corp. (10 pages).

Ronse, K., et al., "Thin Film Interference Effects in Phase Shifting Masks Causing Phase and Transmittance Errors", IMEC (15 pages).

Rosenbluth, A., et al., "Optimum Mask and Source Patterns to Print a Given Shape", IBM (17 pages).

Sakata, M., et al., "A Novel Radiaion Sensitive Spin–on–Glass Convertible into SiO2 and the Simple Fabrication Processing Using It", Oki Electric Industry Co. Ltd. (3 pages).

Schmidt, R., et al., "Impact of Coma on CD Control for Multiphase PSM Designs", AMD, ASML (10 pages).

Sewell, H., et al., "An Evaluation of the Dual Exposure Technique", SVG Lithography Systems Inc. (11 pages).

Spence, C., et al., "Optimization of Phase–Shift Mask Designs Including Defocus Effects", AMD, Princeton University, Vecor Technologies Inc. (8 pages).

Suzuki, A., et al., "Multilevel Imaging System Realizing k1=–.3 Lithography", Canon Inc. (13 pages).

Vandenberghe, G., et al., "(Sub–)100nm Gate Patterning Using 248nm Alternating PSM", IMEC, Mentor Graphics (9 pages).

Fritze, M., et al., "100–nm Node Lithography with KrF?", MIT Lincoln Lab, Numberical Technologies, Photronics, Arch Chemicals (14 pages).

Fukuda, H., et al., "Patterning of Random Interconnect Using Double Exposure of Strong–Type PSMs", Hitachi Central Research Lab (8 pages).

Ferguson, R., et al., "Pattern–Dependent Correction of Mask Topography Effects for Alternating Phase–Shifting Masks", IBM Microelectronics, University of California Berkeley (12 pages).

Toublan, O., et al., "Phase and Transmission Errors Aware OPC Solution for PSM: Feasibility Demonstration", Mentor Graphics Corp. (7 pages).

Yanagishita, Y., et al., "Phase–Shifting Photolithography Applicable to Real IC Patterns", Fujitsu Limited (11 pages).

Levenson, M., et al., "The Phase–Shifting Mask II: Imaging Simulations and Submicrometer Resist Exposures", IEEE Transactions on Electron Devices, vol. ED–31, No. 6, pp. 753–763, Jun. 1984.

IBM, "Method to Produce Sizes in Openings in Photo Images Smaller Than Lithographic Minimum Size", IBM Technical Disclosure Bulletin, vol. 29, No. 3, p. 1328, Aug. 1986.

Burashi, M., et al., "Optical–Diffraction–Based Modulation of Photoresist Profile or Microlithography Applications", Optical Engineering, vol. 28, No. 6, pp. 654–658, Jun. 1989.

Nitayama, A., et al., "New Phase Shifting Mask with Self–Aligned Phase Sifters for a Quarter Micron Photolithography", IEDM, pp. 3.3.1–3.3.4, Dec. 3–6, 1989.

Toh, K., et al., "Chromeless Phase–Shifted Masks: A New Approach to Phase–Shifting Masks", BACUS—Tenth Annual Symposium on Microlithography, Sep. 1990 (27 pages).

Yamanaka, T., et al., "A 5.9um2 Super Low Power SRAM Cell Using a New Phase–Shift Lithography", IEDM, pp. 18.3.1–18.3.4 (1990).

Nakagawa, K., et al., "Fabrication of 64m DRAM with I–Line Phase–Shift Lithography", IEDM, pp. 33.1.1–33.1.4 (1990).

Watanabe, H., et al., "Transparent Phase Shifting Mask", IEDM, pp. 33.2.1–33.2.4 (1990).

Burggraaf, P., "Four More Significant Japanese Advances in Phase Shfiting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Burggraaf, P., "Lithography's Leading Edge, Part 1: Phase–Shift Technology and Part 2: I–Line and Beyond", Semiconductor International, pp. 43–47 and 52–56, Feb. 1992.

Hosono, K., et al., "A Novel Architecture for High Speed Dual Image Generation of Pattern Data for Phase Shifting Reticle Inspection", SPIE—Integrated Circuit Metrology, Inspection, and Process Control VI, vol. 1673, pp. 229–235 (1992).

IBM, "Phase–Shift Mask Utilizing Silicon Oxy–Nitride as a Low Reflectivity Phase–Shift Layer", IBM Technical Disclosure Bulletin, vol. 34, No. 10B, pp. 360–361, Mar. 1992.

Ronse, K., et al., "Comparison of Various Phase Shift Strategies and Application to 0.35um ASIC Designs", SPIE—Optical/Laser Microlithography VI, vol. 1927, pp. 2–16 (1993).

Troccolo, P., et al., "Interferometric Measurement of Etch Depths in Phase Shift Masks", BACUS News, vol. 9, Issue 6, pp. 1 & 4–6, Jun. 1993.

Watanabe, H., et al., "Phase–Shifting Lithography: Maskmaking and its Application", J. Vac. Sci. Technol. B, vol. 11, No. 6, pp. 2669–2674, Nov./Dec. 1993.

Waas, T., et al., "Automatic Generation of Phase Shift Mask Layouts", Microelectronic Engineering, vol. 23, pp. 139–142 (1994).

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Ishida, S., et al., "Large Assist Feature Phase–Shift Mask for Sub–Quarter Micrometer Window Pattern Formation", SPIE, vol. 3096, pp. 333–343 (1997).

Nakae, A., et al., "A Proposal for Pattern Layout Rule in Application of Alternating Phase Shift Mask", SPIE, vol. 3096, pp. 362–374 (1997).

Tsujimoto, E., et al., "Hierarchical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Ltd. (16 pages).

Petersen, J., et al., "Designing Dual–Trench Alternating Phase–Shift Masks for 140nm and Smaller Features Using 248–nm KrF and 193–nm ArF Lithography", Bacus News, vol. 14, Issue 8, pp. 1 & 4–13, Aug. 1998.

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th International Conference on Electron, Ion and Photon Beam Technology and Nanofabrication Abstracts, pp. 18–19, May 30–Jun.

Pierrat, C., "Investigation of Proximity Effects in Alternating Aperture Phase Shifting Masks", Numerical Technologies, Inc. (11 pages).

Cote, M., et al., "A Practical Application of Full–Feature Alternating Phase–Shifting Technology for a Phase–Aware Standard–Cell Design Flow", Numerical Technologies Inc. (6 pages).

Heng, F., et al., "Application of Automated Design Migration to Alternating Phase Shift Mask Design", IBM Research Report RC 21978 (98769), Feb. 26, 2001 (7 pages).

Wong, A., et al., "Alternating Phase–Shifting Mask with Reduced Aberration Sensitivity: Lithography Considerations", Proc. SPIE, vol. 4346, pp. 1–9 (2001).

Wang, R., et al., "Plarized Phase Shift Mask: Concept, Design, amd Potential Advantages to Photolithography Process and Physical Design", Motorola Semiconductor Product Sector (12 pages).

Ogawa, K., et al., "Phase Defect Inspection by Differential Interference", Lasertec Corporation (12 pages).

Pistor, T., "Rigorous 3D Simulation of Phase Defects in Alternating Phase–Shifting Masks", Panoramic Technology Inc. (13 pages).

Semmier, A., et al., "Application of 3D EMF Simulation for Development and Optimization of Alternating Phase Shifting Masks", Infineon Technologies AG (12 pages).

Wong, A., et al., "Polarization Effects in Mask Transmission", University of California Berkeley (8 pages).

Hirai, Y., et al., "Automatic Pattern Generation System for Phase Shfiting Mask", 1991 Symposium on VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Terasawa, T., et al., "Imaging Characteristics of Multi–Phase–Shifting and Halftone Phase–Shifting Masks", Japanese Journal of Applied Physics, vol. 30, No. 11B, pp. 2991–2997, Nov. 1991.

Inoue, S., et al., "Simulation Study on Phase–Shifting Masks for Isolated Patterns", Japanese Journal of Applied Physics, vol. 30, No. 11B, pp. 3010–3015, Nov. 1991.

Watanabe, H., et al., "Detection and Printability of Shifter Defects in Phase–Shifting Masks", Japanese Journal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Moniwa, A., et al., "Algorithm for Phase–Shift Mask Design with Priority on Shifter Placement", Jpn. J. Appl. Phys., vol., 32. Pt. 1, No. 12B, pp. 5874–5879, Dec. 1193.

Ooi, K., et al., "Computer Aided Design Software for Designing Phase–Shifting Masks", Jpn. J. Appl. Phys., vol. 32, Pt. 1, No. 12B, pp. 5887–5891, Dec. 1993.

Ohtsuka, 11., et al., "Evaluation of Repair Phase and Size Tolerance for a Phase–Shift Mask", J. Vac. Sci. Technol. B, vol. 11, No. 6, pp. 2665–2668, Nov./Dec. 1993.

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Ohnuma, H., et al., "Lithography Computer Aided Design Technology for Embedded Memory in Logic", Jpn. J. Appl. Phys., vol. 37, Part I, No. 12B, pp. 6686–6688, Dec. 1998.

Kikuchi, K., et al., "Method of Expanding Process Window for the Double Exposure Technique with alt–PSMs", Optical Microlithography XIII, Proceeding of SPIE, vol. 4000, pp. 121–131 (2000).

* cited by examiner

ALTERNATING PHASE SHIFT MASK DESIGN CONFLICT RESOLUTION

BACKGROUND

1. Field of the Invention

This invention relates to the field of semiconductor devices. More particularly, the invention relates to a method and apparatus for resolving conflicts between phase shifted structures and non-phase shifted structures during the definition of masks to be used in optical lithography processes for manufacturing integrated circuit devices.

2. Description of the Related Art

Semiconductor devices continue to be produced at reduced sizes as optical lithography processes have evolved. Techniques such as phase shifting have been developed to assist in the production of subwavelength features on the integrated circuits (IC) using optical lithography processes. Subwavelength features are features that are smaller than the wavelength of light used to create circuit patterns in the silicon. More generally, phase shifting can be used to create features smaller than a minimum realizable dimension for the given process.

Through the use of phase shifting masks, such subwavelength features can be efficiently produced. (Note, that the term "mask" as used in this specification is meant to include the term "reticle.") One approach to producing a phase shifting mask (PSM) is to use destructive light interference caused by placing two, out of phase, light transmissive areas in close proximity in order to create an unexposed region on a photoresist layer of an IC. If that unexposed area is then protected from exposure when a binary mask is used to expose the remaining field (thus causing definition of the remaining structure), the resultant IC will include subwavelength features created by the PSM.

One approach to preparing an IC for production using PSMs is for one or more features of the IC to be identified for production using PSMs. For example, a designer might identify one or more particular features for production using the PSM, e.g. to define the identified gates (or other features) at subwavelength sizes.

A portion of a design layout 100 for a layer in an IC is shown in FIG. 1. Several distinct portions of the design layout are identified, particularly a field polysilicon 104, a gate 102 and a structure 106. In this example, the gate 102 is identified as "critical", e.g. specified for production using a PSM.

A phase shifting mask 200 for defining the gate 102 is shown in FIG. 2. Light transmissive region 202 and light transmission region 204 are out of phase with one another, e.g. light through one is at phase 0 and the light through the other at phase π. These light transmissive regions are sometimes referred to both individually and collectively as phase shifters (the meaning will be apparent from usage). Additionally, the light transmissive regions are sometimes referred to as phase shifting areas. Also shown on FIG. 2 is an outline 206 of where the structure 106 is relative to the openings for the phase shifters. Particularly, the outline 206 is overlapped by the light transmissive region 204.

Thus, FIG. 2 generally illustrates one example of the class of problems to be addressed. In particular, it is generally preferable to make the phase shifters (e.g. the light transmissive region 202 and the light transmissive region 204) relatively wide compared to the wavelength of the light (λ). For example, some PSM processes attempt to make the total width of the phase shifters and the protective area between them approximately 3λ. However, it is unacceptable to allow the phase shifters to directly overlap areas where there are non-phase shifted structures (e.g. overlap area 208).

Similarly, because of optical effects, e.g. light traveling under the phase shift mask, due to mask misalignment between the PSM and the binary mask, etc., some non-phase shifted structures in close proximity to where phase shifters are placed on the PSM may become exposed at the time the PSM 200 is used.

Accordingly, what is needed is a method and apparatus for resolving conflicts resulting from placement of phase shifters in close proximity to structures being produced other than by phase shifting. Additionally, both a PSM and a binary mask that can produce ICs with subwavelength structures that are in close proximity to at or above wavelength structure are needed.

SUMMARY

Methods and apparatuses for preparing layouts and masks that use phase shifting to enable production of subwavelength features on an integrated circuit in close proximity to other structures are described. Because light can bend around the edges of phase shifting areas in the phase shifting mask, optically proximate—as well as overlapping—structures can become exposed.

In one embodiment, a single edge of the phase shifter is moved away from a corresponding edge in the conflicting structure so that the optical proximity problem is removed. The distance the edge is moved will be based on the wavelength of light (λ) used to produce the IC as well as other information about the optical lithography process. For example for one λ=248 nm process, a distance of approximately 50 nm is used. Thus if the right edge of a phase shifter is less than 50 nm from an edge of a structure (or overlaps the structure) that will be defined other than be phase shifting, the right edge is moved further from the structure's edge to be at least 50 nm away.

Another embodiment optically corrects the shape of the phase shifters in proximity to a conflicting structure. In one embodiment, the edge(s) of the shifter closest to the structure are reshaped to follow the edges of the conflicting structure at a predetermined distance from the structure. For example, in one embodiment 0.2λ is used as a minimum distance. For example, if only the bottom half of the right edge is within 0.2λ of the conflicting structure, then primarily that bottom half is moved further from the edge to be at least 0.2λ away. If the phase shifter started with a rectangular shape, this embodiment can result in non-rectangular shifter shapes.

One embodiment selects from several strategies for resolving conflicts between phase shifters used to define features and proximate structures. For example, one strategy is to change the layout to move structures so that they are no longer in close proximity to the features selected for definition using phase shifting masks. However, a designer might disable this strategy so that it was not available for use in resolving conflicts found in a particular design. The designer might do this if they prefer not to allow their design to be altered, e.g. because only certain cell libraries are to be used, because they do not want to re-verify the design, etc. In this embodiment, the modified layout may, or may not, have the same netlist electrical characteristics as the original layout.

One embodiment adds additional phase shifters to define the conflicting structures. In this approach, a conflicting structure that was not initially designated for definition using phase shifting is marked for definition using phase shifting. This approach may introduce conflicts with previously placed phase shifters as well as other structures. However, in many cases it will allow maximal use of phase shifters to define the features marked for production using phase shifting while maintaining preferred phase shifter sizes.

When this approach is used the binary trim mask used in conjunction with the phase shifting mask will have to be modified as well. This approach may also improve IC yield and IC performance.

In other embodiments, the conflicting structures are sized up, or biased.

In one embodiment, different areas of a layer and/or an integrated circuit can be treated using different techniques. In another embodiment, all areas of a layer and/or an integrated circuit are treated using a single technique.

Resulting integrated circuits can include a greater number of subwavelength features even in areas that are in close proximity to structures that were not initially identified for production using a phase shifting mask.

DETAILED DESCRIPTION

Overview

First a process for resolving conflicts between the placement of phase shifters and layout structures will be considered. Through resolution of these conflicts, a greater number of features in a given IC layout can be produced using phase shifting masks. This in turn leads to ICs with more features of smaller size arranged with higher density and lower overall power consumption.

Next, specific conflict resolution strategies will be examined in greater detail. Then, the selection from among the available conflict resolution strategies will be considered. Finally, additional embodiments of the invention will be discussed.

Process

Figure 3:
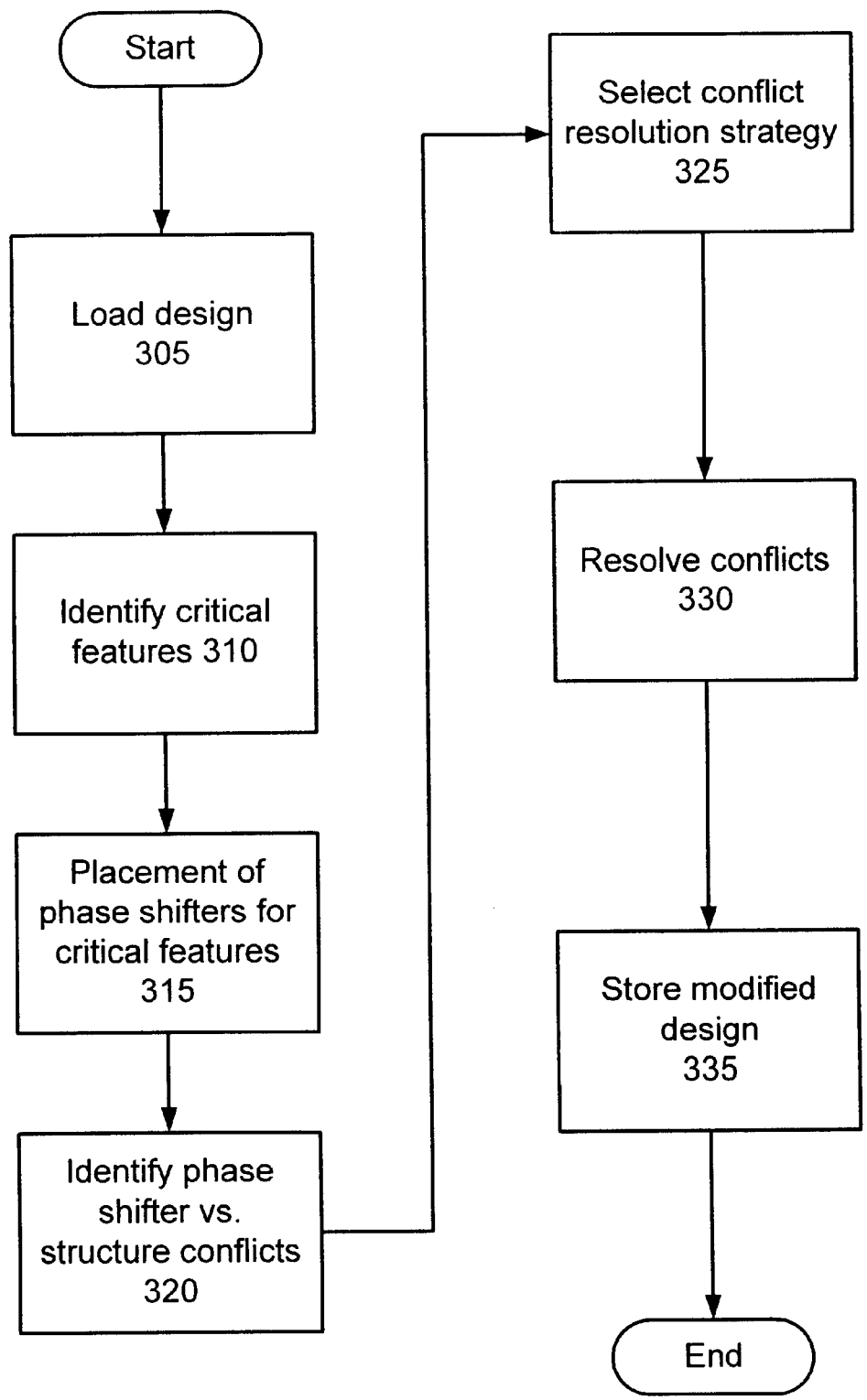
FIG. 3 is a process flow diagram for preparing a design layout for production using phase shifting masks.

FIG. 3 is a process flow diagram for preparing a design layout for production using phase shifting masks. In particular the process 300 can be incorporated into one or more software programs designed for working with design layouts. For example, the iN-Phase(TM) software from Numerical Technologies, Inc., San Jose, Calif. could be adapted to support the process 300. Similarly, electronic design automation (EDA) tools from vendors such as Cadence Designs Systems, Inc., San Jose, Calif., could be adapted to support the process 300. In real-world situations, the process 300 need not be applied to every layer of a given IC layout. The selection of which layers to produce according to the process 300 will be made based on a mixture of business (cost, return from improved yield, etc.) as well as technical concerns (which layers have features that are useful to produce at smaller size and higher density). See below for a discussion of the interaction of optical proximity correction with the process 300.

The process starts at step 305 where the design for the IC layout is loaded into memory, e.g. from disk, across a network, etc. In some embodiments, the design layout may already be in memory. In some embodiments, it may be necessary to load the layout data from a GDS-II data file. At step 305, the data may be transformed into one or more internal representations for processing.

Next, at step 310 one or more critical features are identified. These may be identified programmatically, e.g. according to one or more rules, identification criteria, tags in the layout, etc. According to one embodiment of the invention, critical features are those features within a given layout, or layer, that have been selected for definition using a phase shifting masks. Returning to the example layout shown in FIG. 1, the gate 102 would be an example of a critical feature while the field polysilicon 104 and the structure 106 are examples of non-critical features, or simply structures.

Additionally at step 310, the critical features may be manually identified, or altered, through interactive or batch input provided by a designer, or other user of the software. If interactive identification of critical features is supported, the computer program may display a visual representation of the layout for one or more layers of the IC. The designer can then interactively select features as critical.

Next, at step 315, an initial design of the phase shifting mask is made by defining phase shifters for the critical features. More specifically, the design data can be modified to include one or more additional elements that will later be used, e.g. by mask data preparation programs and/or mask manufacturing programs, to define one or more PSMs. More specifically, a representation for a layer can be divided into a phase shifting representation and a second representation. The second representation may correspond to a binary trim mask, an attenuated binary trim mask (e.g. with some additional phase shifting regions), and/or some other type of mask suitable for use in conjunction with the phase shifting representation. Most generally, the mask corresponding to the second representation should (i) protect areas defined by the PSM, (ii) define structures not defined by the PSM, and (iii) permit artifacts to be cleared from the material.

Figure 1:
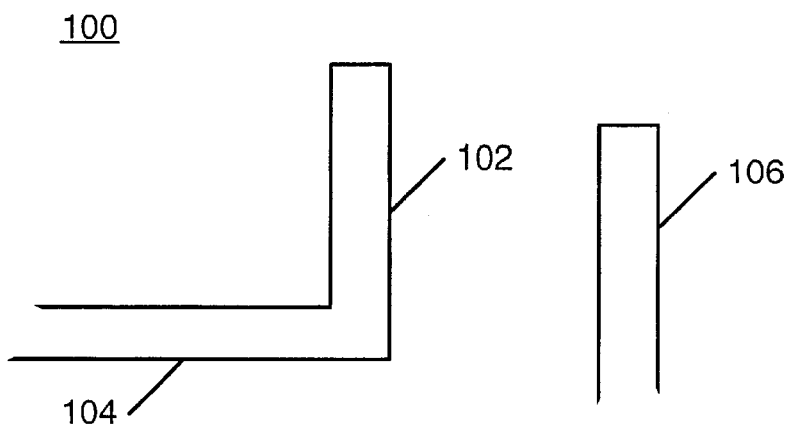
FIG. 1 illustrates a portion of a design layout for an integrated circuit (IC).

Continuing with the example layout of FIG. 1, the phase shifters of the PSM 200 would be placed. At this stage the phase shifters, e.g. the light transmissive region 202 and the light transmissive region 204, are placed at the preferred sizes and dimensions. For example, for a λ=248 nm optical lithography process, the shifters might initially be placed with a width of approximately 350 nm and a space between the two light transmissive regions of approximately 100 nm. (Note that 350 nm+100 nm+350 nm is approximately 3λ.) The specific sizes used at step 315 will depend not only on the wavelength of light, but even more particularly on the IC manufacturing and optical lithography process being used, e.g. off-axis illumination, stepper characteristics, stepper settings, etc.

According to one embodiment of the invention, a model, optionally calibrated based on exposures of test masks to silicon wafers, of the manufacturing and optical lithography process is used to determine the size and spacing of the phase shifters at step 315. For example, the ModelGen™ and/or ModelCal™ software from Numerical Technologies, Inc., San Jose, Calif., can produce suitable models for determining the sizes for placing phase shifters for different types of critical features.

Additionally, at step 315, phase shifter-phase shifter conflicts can be identified and resolved. These shifter-shifter conflicts are also referred to as a coloring problem. This is because the problem of assigning phase to each of the shifters is similar to the problem of color nodes of a graph using two colors (e.g., 0 and π) while observing adjacency constraints on coloring. Similarly, shifter-shifter conflicts occur when the sides (tops, edges, etc.) of different phase shifters overlap and/or when two shifters that are to produce destructive light interference are similarly colored. The process for resolving shifter-shifter conflicts is difficult. The remainder of this discussion will assume there are no shifter-shifter conflicts or that such conflicts have been resolved, possibly by removing one or more phase shifters.

Next, at step 320, conflicts between the proposed phase-shifter placements and structures are identified. In one embodiment, non-phase shifted structures that have an edge within 50 nm (for a λ=248 nm process) of the proposed placement of a phase shifter are considered in conflict. For example, the outline 206 of the structure 106 on the proposed PSM 200 shows a structure less than 50 nm from the proposed phase shifter placement. (In fact, the edge of structure 106 is within the boundaries of the proposed phase shifter.) More generally, any structure with an edge closer than a distance determined based on optical proximity characteristics of the manufacturing process and the wavelength of light used, may be in conflict with the proposed phase shifter placement. In one embodiment, distance of 0.2λ is used to determine the desired minimum distance between a phase shifter and other structures.

Next at step 325, conflict resolution strategies are selected for the conflicts identified at step 320. The specific strategies and the selection of which strategy to apply for a particular phase shifter-structure conflict will be considered in greater detail below.

Once the resolution strategy is selected, the process continues at step 330 with resolution of the phase shifter-structure conflicts according to the selected strategy. Additionally, at this step, verification of the proposed modifications with a design rule checker (DRC), human review and/or inspection, and/or other automated inspection and/or verification processes can occur. For example, if the conflict resolution strategy selected at step 325 was to modify the layout, then at step 330, when the conflict is resolved, the modified layout might be verified using a DRC to confirm that the modified layout complies with the design rules.

Finally, at step 335, the modified design can be stored. For example, one or more GDS-II data files including information for creating the PSM masks could be stored from memory to a disk, network, and/or other storage. The stored design can be used to prepare one or more PSM and binary masks that in turn can be used in producing ICs having one or more layers with one or more subwavelength features in dense regions. The subwavelength features will have been produced using PSMs modified according to the process 300. If desired, the output at step 335 could be prepared in a format suitable for mask manufacturing, e.g. MEBES format, and/or be in an appropriate format to control one or more mask manufacturing machines.

The steps of process 300 can be performed in parallel, in combination and/or with the order modified. For example, steps 310–330 can, in some circumstances, be performed in parallel to allow feature-by-feature placement and resolution.

The process 300 does not directly cover the application of optical proximity correction (OPC) to a layout. In some embodiments, phase shifters are placed and assigned phase prior to the application of either rule based, model based, or hybrid (combination of rule and model based) optical proximity correction. In such an embodiment, the process 300 would occur prior to creating the OPC layout with modified features and structures. In some embodiments, the changes brought about during application of OPC to the layout may require the process 300 to be repeated in part or in whole due to the introduction of additional conflicts between the OPC layout and the shifter placement. A simple example, if the structure, shown by outline 206, is biased up (made wider) then the extent of the overlap area 208 would be greater. Similarly, if the conflict had been resolved previously through the process 300, the structure (see outline 206) with increased bias might cause a conflict even with a modified phase shifter (e.g. the light transmissive region 204.) In some embodiments, as OPC is applied to the layout portions of the process 300 are repeated to correct adjacent phase shifters, e.g. step 320, step 325, and step 330. In some embodiments, the same strategy initially selected at step 325 is reused to resolve the OPC layout induced conflict as was originally used. In other embodiments, different strategies are used.

Conflict Resolution Strategies

A number of conflict resolution strategies for selection at step 325 of process 300 will now be considered. After the strategies are presented, methods for selecting from the available strategies will be discussed.

Strategy 1: Do Not Use PSM to Define Feature

One strategy is to not use a PSM to define the relevant feature(s) with conflicts. This strategy has the undesirable effect that it runs contrary to the indication that a particular feature was to be treated as critical, e.g. defined using a phase shift mask. However, if the conflict cannot be resolved using any other strategy, this strategy may become necessary.

Strategy 2: Ignore the Conflict

Figure 2:
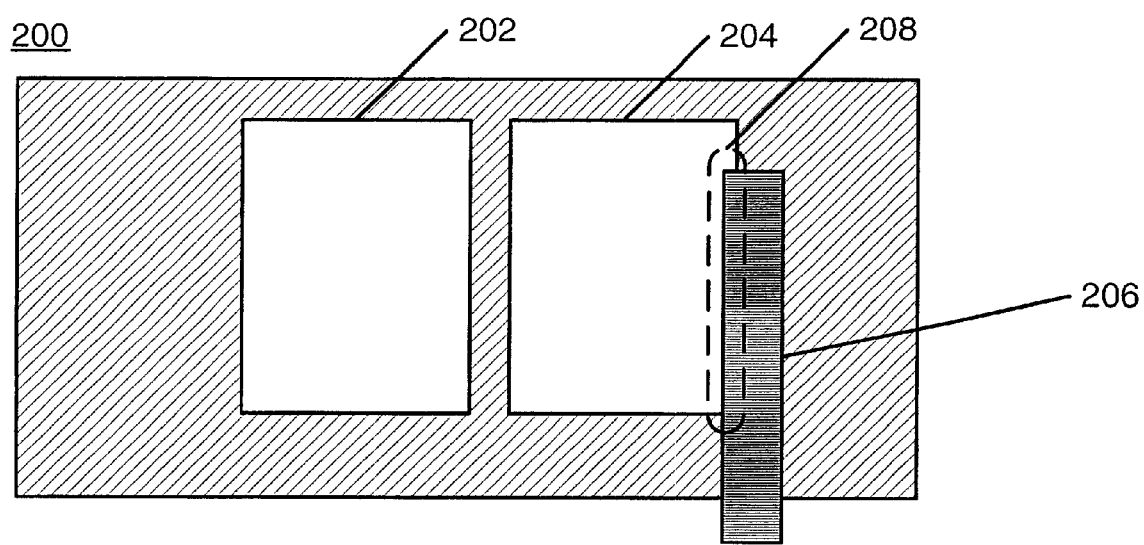
FIG. 2 illustrates a phase shifter-structure overlap on a phase shifting mask.

Another possible strategy is to ignore the conflict. For example, returning to the layout of FIG. 1, the field polysilicon 104 is in fact within close proximity to the phase shifters that are being defined for the gate 102. Specifically, the bottom edge of the light transmissive region 202 abuts the top edge of the field polysilicon 104. This will result in some distortion of the field polysilicon 104 since the area may become partially exposed. Nonetheless, one approach is to ignore the conflict. If the affected areas are areas of high process latitude this may be an acceptable strategy. (This strategy is probably not acceptable if the phase shifter overlaps the structure as shown in FIG. 2 with overlap area 208.)

Strategy 3: Pull in an Edge of One or Both Parts of the Phase Shifter

Figure 4:
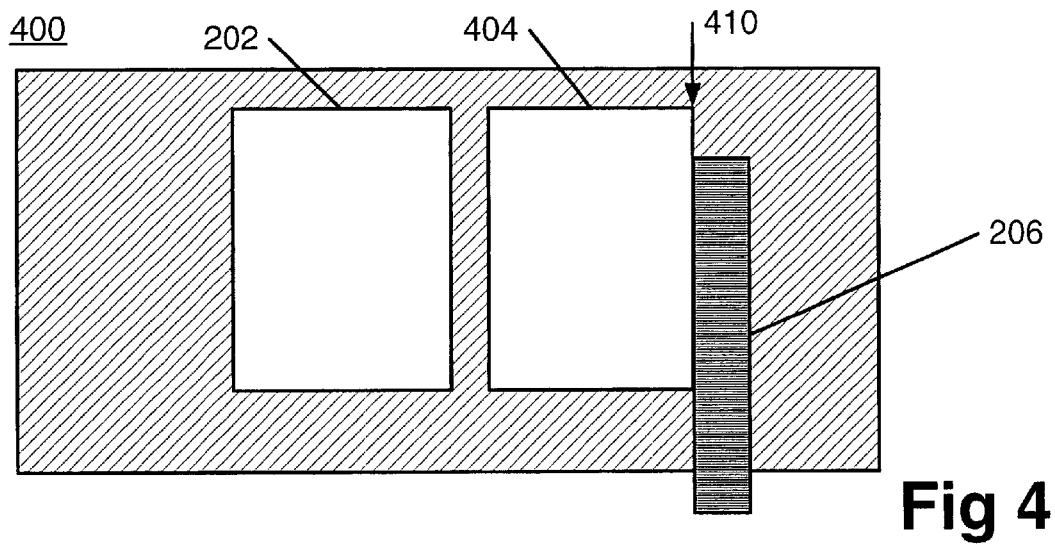
FIG. 4 illustrates a phase shifting mask with a phase shifter-structure conflict partially resolved by pulling in an edge of the phase shifter so that it abuts the edge of the conflicting structure.
Figure 5:
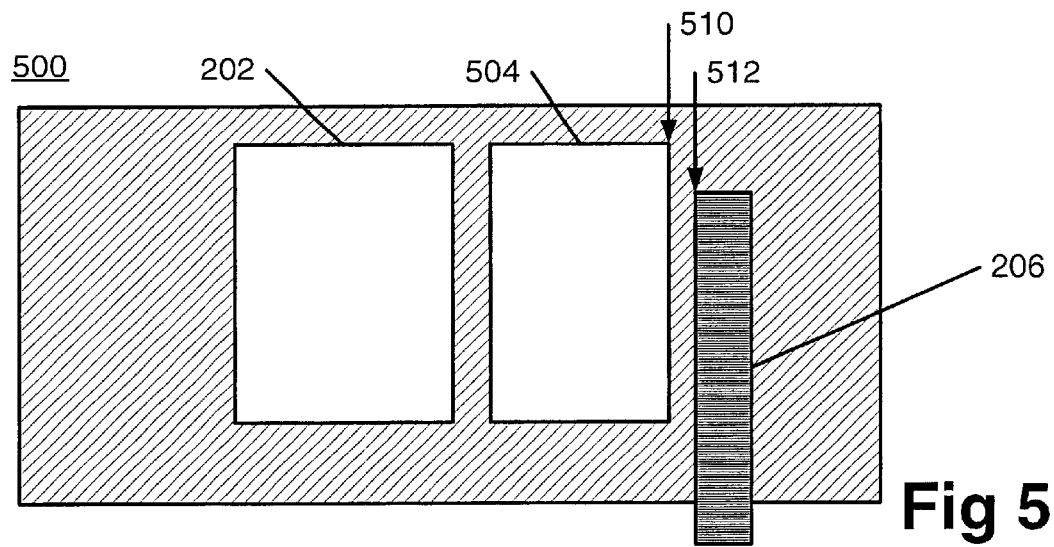
FIG. 5 illustrates a phase shifting mask with a phase shifter-structure conflict resolved by pulling in an edge of the phase shifter so that it is no longer in close (optical) proximity to the edge of the conflicting structure.

FIGS. 4–5 show examples of how to resolve the phase shift-structure conflict of the layout of FIG. 1 by pulling in an edge of one side of the phase shifter.

In FIG. 4, a PSM 400 has a light transmissive region 404 that is narrowed in width (relative to the width of the light transmissive region 204) such that the edge 410 of the region 404 abuts the edge of the conflicting structure. In this example, the corresponding edge of the light transmissive region 202 (e.g. the other "half" of the shifter) is not pulled in; however, it can be pulled in as well.

FIG. 5 illustrates a variation of this strategy. Here on PSM 500, the edge 510 of the light transmissive region 504 is pulled back from the edge 512 of the conflicting structure by a sufficient distance so as to no longer be in conflict. For example, using the 50 nm guideline described above for the example 248 nm process, the edge 510 and edge 512 would be 50 nm or further apart. The corresponding edge of the light transmissive region 202 could be similarly pulled back if there is a desire to maintain a balanced size for the two light transmissive regions of the phase shifter (not shown).

The strategy adopted in FIG. 5 could also be used to resolve the conflict between the phase shifter and the field polysilicon 104 (not shown). Specifically, the bottom edge of the light transmissive region 202 could be pulled back from the top edge of the field polysilicon 104, e.g. 50 nm. Additionally, in some embodiments a corresponding change would be made to the bottom edge of the light transmissive region 504 so that the height of the phase shifter is uniform.

In some embodiments, the proportionality of the phase shifter is preserved. Thus, when the shifter is pulled back in one dimension (e.g. width), the corresponding other dimension (e.g. height) is proportionately reduced in size (not shown). This embodiment is sometimes done with corresponding changes made to both light transmissive regions that comprise the phase shifter to produce similarly sized phase shifters (not shown).

Strategy 4: Perform OPC to Reshape Phase Shifter

Figure 6:
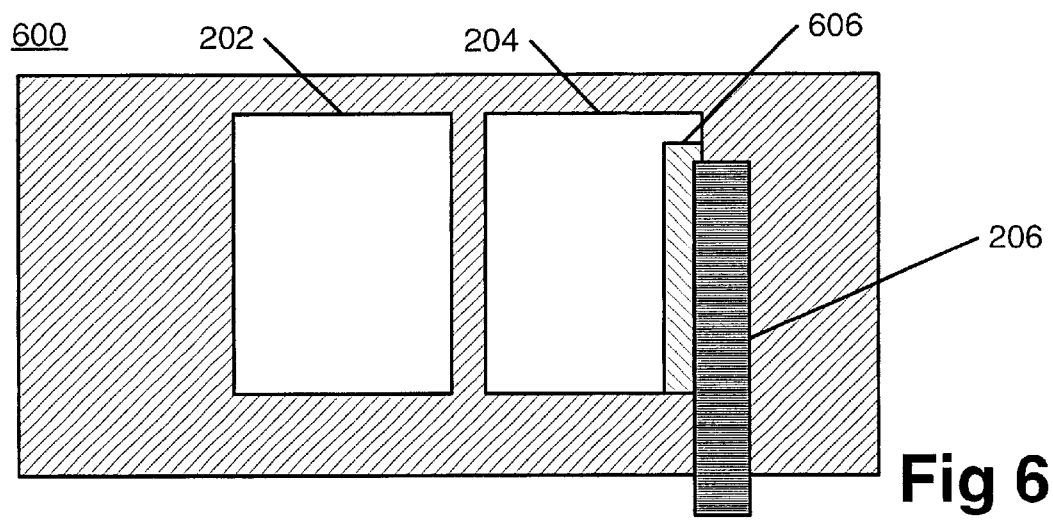
FIG. 6 illustrates a phase shifting mask with a phase shifter-structure conflict resolved by applying rule-based optical proximity correction to the phase shifter.

FIG. 6 illustrates a phase shifting mask 600 with a phase shifter-structure conflict resolved by applying rule-based optical proximity correction (OPC) to the light transmissive regions that make up the phase shifter. In particular the light transmissive region 204 is modified by optical proximity correction to include a (relatively large) opaque region 606 that conforms in shape to the outline of the nearby structure 106 (shown as outline 206). (Note, the opaque region 606 is shown with different hashing to make it stand out from the opaque field of the PSM 600.)

Note also that this strategy may result in irregular (non-rectangular) phase shifting regions. For example, the light transmissive region 204 (as modified by the opaque region 606) is no longer rectangular. Also note that the edges of the light transmissive region 204 (as modified by the opaque region 606) now generally parallel corresponding edges of the structure 106.

This approach could also be adopted for handling the field polysilicon 104 that abuts the phase shifter (not shown). Specifically, the bottom edge of the light transmissive region 202 could receive an OPC inserted opaque region across the bottom and the light transmissive region 204 might receive an (relatively small) opaque region in the lower left corner.

In one embodiment, the size of the OPC region added to the PSM is related to the spacing dimension used for conflicts. For example, using the 50 nm minimum distance for determining conflicts, OPC features could be added to the PSM 600 to ensure that edges of the light transmissive windows that make up the phase shifters are 50 nm or further from the edge of the conflicting structure.

Figure 7:
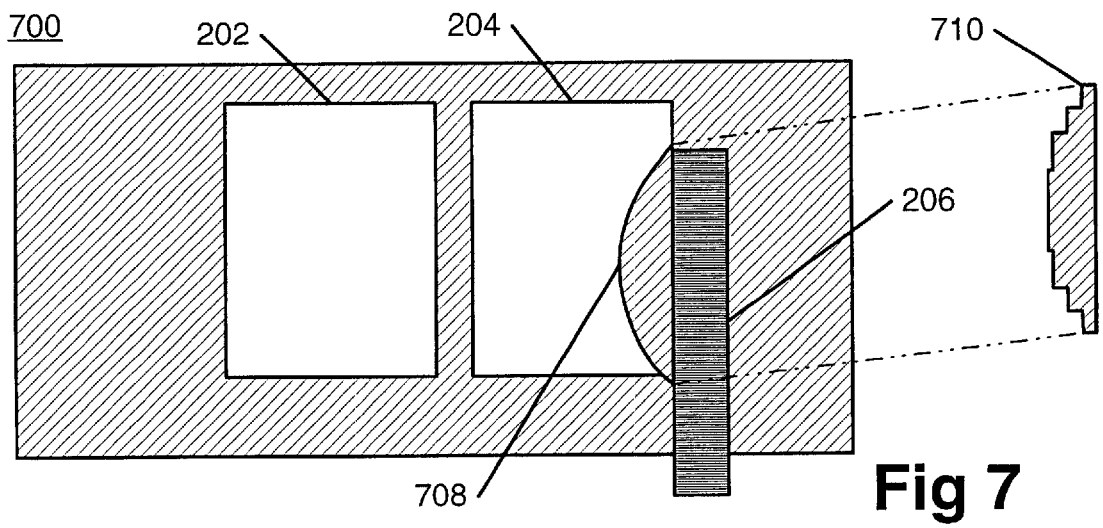
FIG. 7 illustrates a phase shifting mask with a phase shifter-structure conflict resolved by applying model-based optical proximity correction to the phase shifter.

Another OPC correction, this time more typical of model-based OPC, used by embodiments of the invention is shown in FIG. 7. Specifically, FIG. 7 includes a PSM 700 having a light transmissive region 202 and a light transmissive region 204. The protective chrome added by model-based OPC is shown as the opaque region 708. However, the bowed/arched shape of the OPC chrome is not accurately reproducible on many mask manufacturing machines, accordingly an approximation of the region is made that uses square edges, for example the opaque region 710 approximates the opaque region 708, but is more easily manufactured.

Strategy 5: Chance the Layout

In some situations it may be possible to solve the conflict by changing the layout. For example, the layout 100 could be modified so that the structure 106 was a greater distance away from the gate 102. This might either be accomplished by moving the structure 106 further to the right, moving the gate 102 further to the left, combinations of the same, and/or other layout changes. In one embodiment the layout is changed while maintaining the same netlist electrical characteristics. In one embodiment, the design is modified to provide equivalent functionality with a different netlist electrical characteristic.

In one embodiment, programs such as abraCAD™ software from Cadabra Design Automation, Inc., a Numerical Technologies Company, of Ottawa, Ontario, Canada, are used to redesign a cell layout.

Strategy 6: Use Phase Shifters to Define Other Areas

Figure 8:
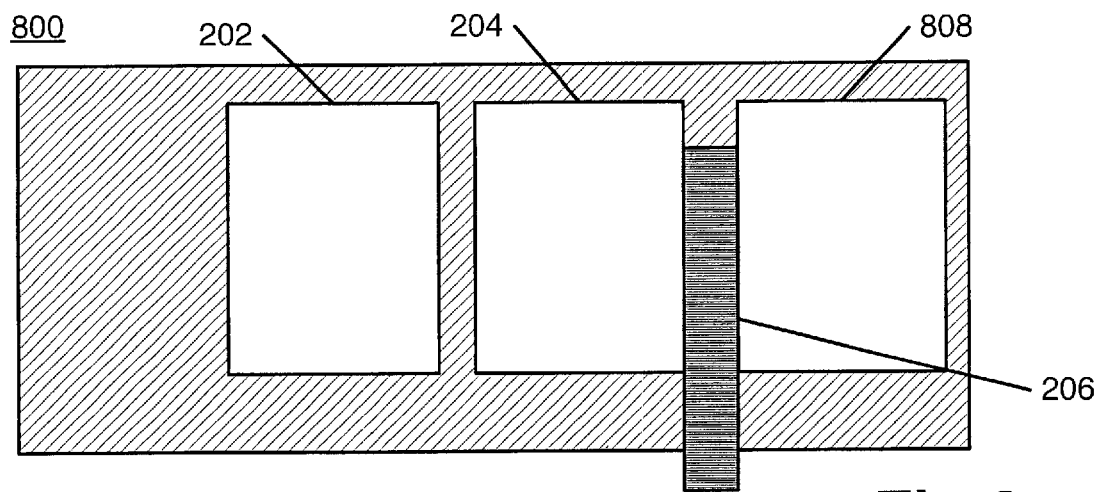
FIG. 8 illustrates a phase shifting mask with a phase shifter-structure conflict resolved by defining the conflicting structure with additional phase shifters on the phase shifting mask.

Another strategy is to use phase shifters to define (a portion of) the structure causing the conflict. FIG. 8 illustrates a PSM 800 that will define a portion of the structure 106 (shown as outline 206 on FIG. 8) using an additional light transmissive region 808. The light transmissive regions 808 should be out of phase with the light transmissive region 204. In one embodiment, this is referred to as making the structure 106 (and more generally the conflicting structure) "preferred-critical", indicating that the structure is preferred to be produced using a PSM. This approach may introduce some additional conflicts, both shifter-shifter conflicts (step 315) as well as new phase shifter-structure conflicts which will have to be identified (step 320) and resolved (step 325).

Thus the term "preferred critical", if the newly introduced phase shifting region (light transmissive region 808) would prevent a previously identified critical feature (e.g. from step 310) from being produced using a PSM, a different conflict resolution strategy could be selected.

Note also that the phase shifters used to define preferred critical regions may be defined so as not to reduce the critical dimension of the preferred critical structure. This is shown in FIG. 8 (phase shifters abut the structure 106 location). In contrast if the space between the two phase shifters (e.g. the chrome regulator) was smaller than the structure 106, the critical dimension of the structure 106 would be reduced.

In some embodiments if the light transmissive region 808 would be too close to an already placed phase shifter, the overall coloring of the layout can be redone to see if the conflict can be solved. Another alternative is to match the phase of the light transmissive region 808 with that of the light transmissive region 204 and upwardly bias the size of the structure 106 (see below for more discussion of biasing). For example if the light transmissive region 204 is at phase $\pi$ and another light transmissive region (not shown) in close proximity to the light transmissive region 808 is also of phase $\pi$, the light transmissive region 808 can be merged with that other region and have phase π. The structure 106 will not be defined by the phase shifting mask, but the structure 106 should be biased up in size to ensure proper printing.

Figure 9:
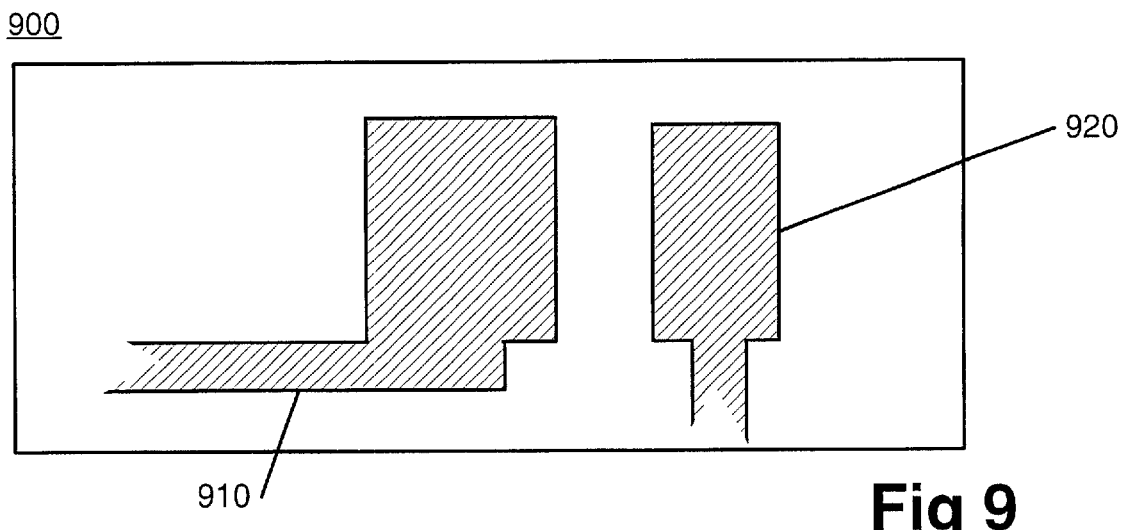
FIG. 9 illustrates a binary trim mask for use in conjunction with the phase shifting mask of FIG. 8.

FIG. 9 illustrates a binary trim mask 900 suitable for use in conjunction with the phase shifting mask of FIG. 8. Specifically, the trim mask 900 includes protect 910 and protect 920 to prevent the exposure of the field polysilicon 104 and the structure 106 (respectively). Additionally, the binary trim mask protects the regions of destructive light interference created by the phase shifting mask 800. Thus the protect 910 is wider than the gate 102. Similarly, the protect 920 is wider than the structure 106 at some points. The extra width is useful for ensuring that light does not bend around the protect and expose the area where the respective features (gate 102 and phase shifted portion of structure 106) are. (Note, more generally the blocking area should be smaller than the shifter, but larger than the mask misalignment error and/or other error factors.)

Strategy 7: Bias Structures

An additional strategy to address some problems is to bias, or size up, the non-phase shifted features. For example, the field polysilicon 104 could be biased from the original layout 100, e.g. an additional 20–30 nm for the $\lambda$=248 nm process being considered (more generally the size up is approximately $0.1\lambda$). The result is that even if the phase shifters allow light to bleed onto the field polysilicon 104 the resulting feature will be of approximately the originally intended size. Similarly, in one embodiment, the structure 106 could be biased.

Strategy 8: Combination of the Above Strategies

It is also possible to apply combinations of the above strategies. For example, combining pull-in with OPC is possible.

Strategy Selection

A number of possible strategies for handling phase shifter-structure conflicts have been presented. It is useful to consider how the different solutions might be selected at step 325 as part of the process 300.

In one embodiment, the computer program, or programs, supporting the process 300 support one or more conflict resolution strategies of the type described above. A subset of those strategies can be selected, e.g. interactively or from stored data. The selected strategies would be the ones actively considered for application to conflicts in a particular layout. Additionally, the (selected) strategies may be ranked in order of preference for selection. In one embodiment, the computer program includes a predetermined ranking of conflict resolution strategies.

In another embodiment, designers provide a ranking of the strategies. By allowing designers to flexibly control the selected strategies the program permits the designer to control how applying phase shifting to critical features (identified at step 310) will affect the design as a whole. For example, the strategies for modifying the layout to resolve conflicts might be disabled. Similarly, the designer might specify a preference for using phase shifters to define the conflicting structural areas in preference to decreasing the size of the phase shifters.

The preferred ranking may vary based on the nature of the conflict. For example, for conflicts between a shifter for a gate and the connective field polysilicon, the ranking may indicate a preference for applying OPC to the phase shifter (e.g. field polysilicon 104 vs. gate 102 conflict). In contrast for shifter-structure conflicts (e.g. shifters for the gate 102 vs. structure 106), the ranking may indicate a preference for using phase shifters to define the conflicting structure.

Alternative Embodiments

Although the discussion has focused on defining features using phase shifting masks it may also be desirable to also perform optical proximity correction (OPC) on the provided layout. This is distinct from the OPC strategy for adjusting the phase shifters. More specifically, OPC in the context of a layout generally refers to the addition of subwavelength features such as hammerheads, endcaps, and serifs to a design. Returning to the layout 100 of FIG. 1. Light will diffract around the edges of protective areas of a mask. For example, in printed exposure of a binary mask for the layout 100, the top edge of structure 106 might be shortened or pulled in. Adding OPC to the structure 106, e.g. a hammerhead, will allow the structure 106 to print more clearly. OPC can be integrated into the process 300 or can be separately performed.

In some embodiments, defining gates at subwavelength sizes is referred to as "shrinking" gates. This colloquialism comes about because it reflects the size correspondence between regularly produced features and phase shifting mask-produced features.

Embodiments of the invention can be used with a variety of lithographic techniques including, for example, deep ultraviolet (DUV), extreme ultraviolet (EUV), and x-ray lithographic processes.

In some embodiments, the ordering of events in the process 300 is altered. For example, in one embodiment, phase shifters are placed at step 315 at a first small size and are then expanded to the preferred size using the conflict resolution strategies as needed. For example, if $3\lambda$ is the preferred total size for a phase shifter in (including both light transmissive regions and the protective area between the regions) and $0.8\lambda$ is the minimum allowable phase shifter size (for each light transmissive region), then at step 315 shifters could be placed with size $0.8\lambda$. Then, shifters could be selectively enlarged so that the total size of the shifter pair approaches $3\lambda$ while checking for conflicts (step 320) and determining resolution strategies (step 325) so as to permit the phase shifter to be as large as possible.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated).

For example, the transmission medium may include a communications network, such as the Internet. In one embodiment, the computer readable storage medium includes one or more computer programs for identifying critical features, defining phase shifters for critical and/or preferred critical features, identifying conflicts between phase shifters and structures, selecting strategies for resolving conflicts, and/or resolving conflicts. A program is a sequence of instructions for execution by a computer. In one embodiment, the electromagnetic waveform comprises computer programs accessed over a network, the computer programs for identifying critical features, defining phase shifters for critical and/or preferred critical features, identifying conflicts between phase shifters and structures, selecting strategies for resolving conflicts, and/or resolving conflicts.

In one embodiment, the electromagnetic waveform comprises computer data corresponding to a layout prepared according to the process 300. In one variation of this embodiment, the computer data is formatted according as one or more GDS-II data files. For example, the computer data could be the output of the process 300 being accessed across a network by mask data preparation software, e.g. CATS from Transcription Enterprises, Inc., a Numerical Technologies Company.

The foregoing description of embodiments of the invention has been provided for the purposes of illustration and description. It is not intended to be exhaustive or to limit the invention to the precise form disclosed. Many modifications and variations will be apparent. The embodiments were chosen and described in order to best explain the principles of the invention and its practical application, thereby enabling others to understand the invention for various embodiments and with various modifications as are suited to the particular use contemplated. It is intended that the scope of the invention be defined by the following claims.

We claim:

1. A method for producing phase shifting layout data from a portion of an integrated circuit (IC) layout of a layer of material, the method comprising:

identifying a feature in the IC layout for definition with a phase shifting layout using a computer;

generating using a computer the phase shifting layout data using the IC layout, the phase shifting layout data defining phase shifting areas in an opaque field for defining the feature in the material, the phase shifting layout data adapted to be used in conjunction with a second layout data, the second layout data defining other structures in the material, and preventing exposure of the feature, the second layout data corresponding to a trim mask for use in conjunction with a phase shifting mask corresponding to the phase shifting layout data;

determining using a computer if the phase shifting layout data will result in a conflict with other structure in the material; and modifying the phase shifting layout data to resolve the conflict by adjusting the phase shifting layout to optically correct for the conflict with other structure in the material using a computer.

2. The method of claim 1, wherein the phase shifting layout data defines at least a first light transmissive region having at least one edge, and wherein the modifying comprises replacing the edge with a plurality of edges, each of the plurality of edges a sufficient distance from corresponding edges of conflicting other structure such that the phase shifting layout data no longer results in the conflict with other structure in the material.

3. The method of claim 1, wherein the phase shifting layout data defines at least a first light transmissive region having at least one edge, and wherein the modifying further comprises redefining the first light transmissive region such that the at least one edge of the light transmissive region a sufficient distance from corresponding edges of conflicting other structure such that the phase shifting layout data no longer results in the conflict with other structure in the material.

4. The method of claim 1, wherein $\lambda$ is a wavelength of light for use in production of the layer of material and the phase shifting layout data defines at least a first light transmissive region having at least one edge, and wherein the determining further comprises computing for the at least one edge whether it is a predetermined multiple of away from other structure.

5. The method of claim 4, wherein the predetermined multiple of $\lambda$ is 0.2.

6. An electromagnetic waveform embodied on a carrier wave, the electromagnetic waveform comprising a computer program for modifying a phase shifting layout data for a portion of an integrated circuit (IC) layout of a layer of material to resolve a conflict between placement of phase shifting areas and structures to be produced other than by phase shifting areas, the phase shifting layout data defining at least a first phase shifting area, the IC layout defining at least a first structure, the computer program further comprising:

a first set of instructions for determining whether there is a conflict between the at least a first phase shifting area and the at least a first structure in the IC layout, the conflict corresponding to whether production of the layer of material using a mask defined by the phase shifting layout would result in exposure of a portion of the at least a first structure, wherein the determining includes simulating optical proximity characteristics of a manufacturing process;

a second set of instructions for further defining the phase shifting layout to include at least a second phase shifting area response to the determining, the at least a second phase shifting area to assist in production of the structure in the layer of material using the phase shifting layout.

7. The electromagnetic waveform of claim 6, wherein the at least a first phase shifting area has a first plurality of edges and wherein the at least a first structure as a second plurality of edges, and wherein the first set of instructions further comprises a set of instructions for analyzing distance between pairs of edges in the first plurality of edges and edges in the second plurality of edges, and determining that the conflict exists if distance between any pair of edges less than a predetermined amount.

8. The electromagnetic waveform of claim 7, wherein the predetermined amount determined from a wavelength of light ($\lambda$) to be used in producing the layer of material.

9. The electromagnetic waveform of claim 6, wherein the phase shifting layout further defining a third phase shifting area, the computer program further comprising a third set of instructions for determining whether there are phase assignment conflicts among the at least a first phase shifting area, the at least a second phase shifting area, and the third phase shifting area.

10. The electromagnetic waveform of claim 9, wherein the computer program further comprises a fourth set of instructions for removing the at least a second phase shifting area from the phase shifting layout responsive to the determining and for modifying one or more of the at least a first phase shifting area, the IC layout, and the phase shifting layout to resolve the conflict identified by the first set of instructions.

11. The electromagnetic waveform of claim 9, wherein the computer program further comprises a fourth set of instructions for assigning same phase to the first phase shifting area and the second phase shifting area responsive to the determining and for modifying the IC layout to upwardly bias the structure.

12. An apparatus for producing phase shifting layout data from a portion of an integrated circuit (IC) layout of a layer of material, the apparatus comprising:

means for identifying a feature in the IC layout for definition with a phase shifting layout;

means for generating the phase shifting layout data using the IC layout, the phase shifting layout data defining phase shifting areas in an opaque field for defining the feature in the material, the phase shifting layout data adapted to be used in conjunction with a second layout data, the second layout data defining other structures in the material, and preventing exposure of the feature, the second layout data corresponding to a trim mask for use in conjunction with a phase shifting mask corresponding to the phase shifting layout data;

means for determining if the phase shifting layout data will result in a conflict with other structure in the material; and means for modifying the phase shifting layout data to resolve the conflict by adjusting the phase shifting layout to optically correct for the conflict with other structure in the material.

13. The apparatus of claim 12 wherein the means for modifying further comprises means for applying rule-based optical proximity correction (OPC) to the phase shifting layout to correct for the conflict.

14. The apparatus of claim 12 wherein the means for modifying further comprises means for applying model-based optical proximity correction (OPC) to the phase shifting layout to correct for the conflict.

15. The apparatus of claim 12 wherein the means for modifying further comprises means for selecting a conflict resolution strategy from a plurality of strategies for correcting for the conflict.

16. The apparatus of claim 15 wherein the means for selecting further comprises means for accessing a ranking of the plurality of strategies and applying highest ranked strategy that can correct for the conflict.

17. A mask with a plurality of phase shifting areas for use in defining a portion of an IC layout of a layer of material, another portion of the IC layout being defined by a trim mask, the phase shifting areas being defined by the following process:

determining if a first phase shifting area in the plurality of phase shifting areas result in a conflict with structure in the material due to optical proximity effects; and modifying the first phase shifting area to optically correct for the conflict with structure in the material using a computer.

18. The mask of claim 17, wherein the modifying further comprises applying at least one of rule based OPC and model based OPC to the first phase shifting area to correct for the conflict.

19. The mask of claim 17, wherein the first phase shifting area in conflict with a structure, and the modifying further comprising adding at least one phase shifting area to the mask to define the structure using the mask.

20. A system for defining phase shifting layout data from a portion of an integrated circuit (IC) layout of a layer of material, the system comprising:

a memory, the memory comprising
a layout data for a portion of an IC layout of a layer of material,
a phase shifting layout data,
a first computer program for defining the phase shifting layout data including phase shifting areas in an opaque field to define features in the material,
a second computer program for identifying if the phase shifting layout data will result in a conflict with other structure in the material,
a third computer program for resolving conflicts between phase shifting layout data and other structure in the material, and
a fourth computer program for coordinating operation of the first computer program, the second computer program, and the third computer program on the layout data;

a processor for executing the first computer program, the second computer program, the third computer program, and the fourth computer program.

21. The system of claim 20, wherein the memory further comprises a plurality of computer programs designed for invocation by the third computer program, each of the plurality of computer programs for resolving conflicts between phase shifting layout data and other structure in the material according to a predefined strategy.

22. The system of claim 21, wherein one of the plurality of computer programs comprises a computer program for performing OPC to shape of phase shifting areas in the phase shifting layout data to resolve conflicts between phase shifting layout data and other structure in the material.

23. The system of claim 20, wherein the memory further comprises a fifth computer program for applying optical proximity correction to the layout data and wherein the fourth computer adapted to coordinate execution of the fifth computer program, and wherein the processor further for executing the fifth computer program.

24. The system of claim 23, wherein the fourth computer program invokes the second computer program and the third computer program after execution of the fifth computer program to resolve conflicts between phase shifting areas and other structure introduced by execution of the fifth computer program.

25. The system of claim 23, wherein the fifth computer program designed so as not to introduce further conflicts between phase shifting areas and other structures during the applying of optical proximity correction to the layout data.

26. The system of claim 20, wherein the processor comprises a plurality of processors.

* * * * *